(12) United States Patent
Tan et al.

(10) Patent No.: US 8,072,066 B2
(45) Date of Patent: Dec. 6, 2011

(54) METAL INTERCONNECTS FOR INTEGRATED CIRCUIT DIE COMPRISING NON-OXIDIZING PORTIONS EXTENDING OUTSIDE SEAL RING

(75) Inventors: Liang Tan, Pittsford, NY (US); Herbert J. Erhardt, Webster, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1083 days.

(21) Appl. No.: 11/048,975

(22) Filed: Feb. 2, 2005

(65) Prior Publication Data

US 2005/0269706 A1 Dec. 8, 2005

Related U.S. Application Data

(60) Provisional application No. 60/577,036, filed on Jun. 4, 2004.

(51) Int. Cl.
- *H01L 23/48* (2006.01)
- *H01L 23/50* (2006.01)
- *H01L 23/528* (2006.01)
- *H01L 23/532* (2006.01)

(52) U.S. Cl. . 257/735; 257/741; 257/758; 257/E23.014; 257/E23.017; 257/E23.152; 257/E23.154

(58) Field of Classification Search .................. 257/758, 257/620, E21.523, E21.524, 763, 770, 734, 257/735, 741, E23.01, E23.011, E23.012, 257/E23.013, E23.014, E23.017, E23.141, 257/E23.142, E23.143, E23.145, E23.151, 257/E23.152, E23.153, E23.154, E23.155, 257/E23.157, E23.161, E23.163; 438/462

See application file for complete search history.

(56) References Cited

U.S. PATENT DOCUMENTS

| | | | | |
|---|---|---|---|---|
| 5,795,796 | A  * | 8/1998 | Kim | 438/660 |
| 6,300,223 | B1 * | 10/2001 | Chang et al. | 438/460 |
| 6,521,975 | B1 * | 2/2003 | West et al. | 257/620 |
| 6,815,821 | B2 * | 11/2004 | Yu | 257/758 |
| 7,053,453 | B2 * | 5/2006 | Tsao et al. | 257/374 |
| 7,224,042 | B1 * | 5/2007 | McCollum | 257/620 |
| 2002/0024115 | A1 | 2/2002 | Ibnabdeljalil et al. | |
| 2003/0089997 | A1 | 5/2003 | Mergenthaler et al. | |
| 2003/0122220 | A1 | 7/2003 | West et al. | |
| 2006/0267154 | A1* | 11/2006 | Pitts et al. | 257/620 |

* cited by examiner

*Primary Examiner* — Samuel Gebremariam
*Assistant Examiner* — Andrew O. Arena
(74) *Attorney, Agent, or Firm* — Blakely Sokoloff Taylor & Zafman LLP

(57) ABSTRACT

An integrated circuit includes a substrate; a sealing element spanning a periphery of the substrate that forms a protective boundary for the substrate; a plurality of copper lines spanning the substrate in at least two distinct layers contained within the protective boundary; a first conducting element disposed outside the sealing element; and one or more second conducting elements connecting at least two of the copper lines and that spans the sealing element; wherein the conducting elements are substantially non-oxidizing metals that are resistant to oxidization and that connect the copper line to the first conducting element.

19 Claims, 2 Drawing Sheets

METAL INTERCONNECTS FOR INTEGRATED CIRCUIT DIE COMPRISING NON-OXIDIZING PORTIONS EXTENDING OUTSIDE SEAL RING

CROSS-REFERENCE TO RELATED APPLICATIONS

This is a 111A applicaton of Provisional Application Ser. No. 60/577,036, filed Jun. 4, 2004.

FIELD OF THE INVENTION

The invention relates generally to the field of metal interconnects for image sensors and, more particularly, to such interconnects that are made of copper and that are connected via non-corrosive metals to circuitry external to the seal ring.

BACKGROUND OF THE INVENTION

Image sensors include a substrate having a plurality of pixels. Each pixel typically includes a photosensitive area that converts incident light into charge packets. One of more transistors are connected to the photosensitive area for various purposes, such as passing the charge therefrom and for signal processing of the charge packet that may be external to the imaging area. Each of the transistors is connected to a voltage source for permitting the transistors to be operated as desired. A plurality of buses connects the transistors to voltage sources.

The buses are typically layered, one above another, and they are connected together through electrical connection, VIAs and pre-contacts, and they eventually pass through an internal seal ring to an external pad. These external pads on the wafer DIEs are eventually connected to package leads to form the electrical connections.

Typically the buses are made of either aluminum (Al) or copper (Cu). However, extending the copper outside the internal seal ring exposes the copper to air and the like which causes the copper to be oxidized. Aluminum is less likely to be oxidized when exposed to air; however, its conductivity is lower than copper.

Consequently, a need exists for image sensors that use copper for its conductive properties, but also resists its tendency to be oxidized when exposed to air.

SUMMARY OF THE INVENTION

The present invention is directed to overcoming one or more of the problems set forth above. Briefly summarized, according to one aspect of the present invention, the invention resides in an integrated circuit having a substrate; a sealing element spanning a periphery of the substrate that forms a boundary for the substrate; two metal lines spanning the substrate in at least two distinct layers contained within the boundary; a first conducting element disposed outside the sealing element; and one or more second conducting elements connecting the two metal lines and that spans the sealing element; wherein the conducting elements are substantially non-oxidizing metals that are resistant to oxidation and that connect the metal lines to the first conducting element.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of using copper internal of the seal ring, but does not extend it external to the seal ring. Instead, corrosion resistant metals in the VIAs and pre-contacts, such as tungsten, are used external to the seal ring.

DETAILED DESCRIPTION OF THE INVENTION

Figure 1:
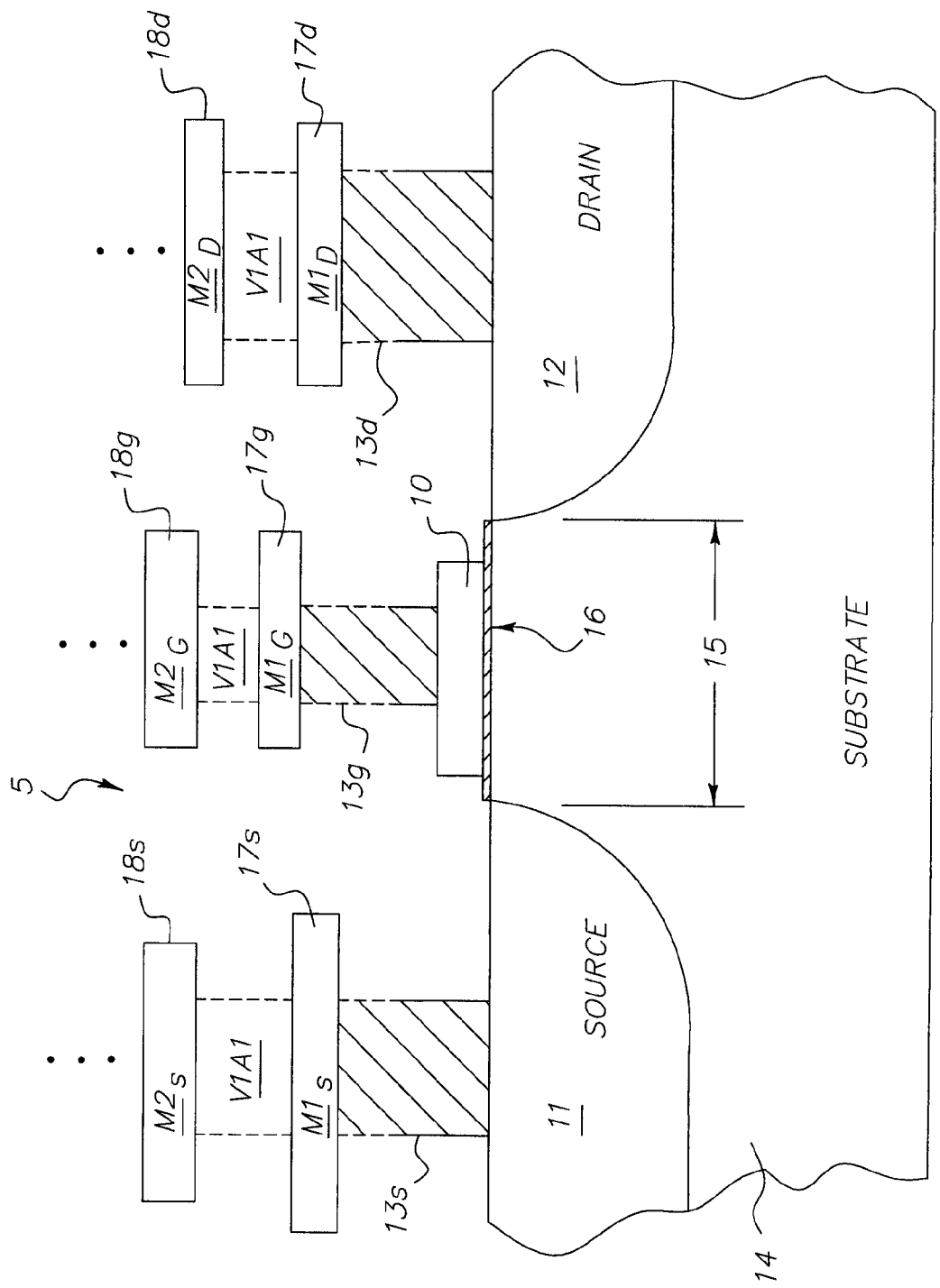
FIG. 1 is a side view in cross section of a typical transistor of the present invention.

Before discussing the present invention, it is beneficial to discuss some terms as used herein. In this regard, pre-contacts are electrical connections between the semiconductor substrate and the metal layer immediately above it, metal 1. VIAs are electrical connections between adjacent metal lines, for example metal 1 and metal 2. It is further noted that the source, gate and drain will each have its own pre-contact and respective metal layers. For example, the source will have its own pre-contact, metal 1, metal 2, metal 3, and metal 4, and the gate will have its own pre-contact, metal 1, metal 2, metal 3, and metal 4. Even though each has a metal layer 1 and the like, it is noted that they are different from each other, and the 1 denotes it is the metal layer immediately above the substrate.

Figure 2:
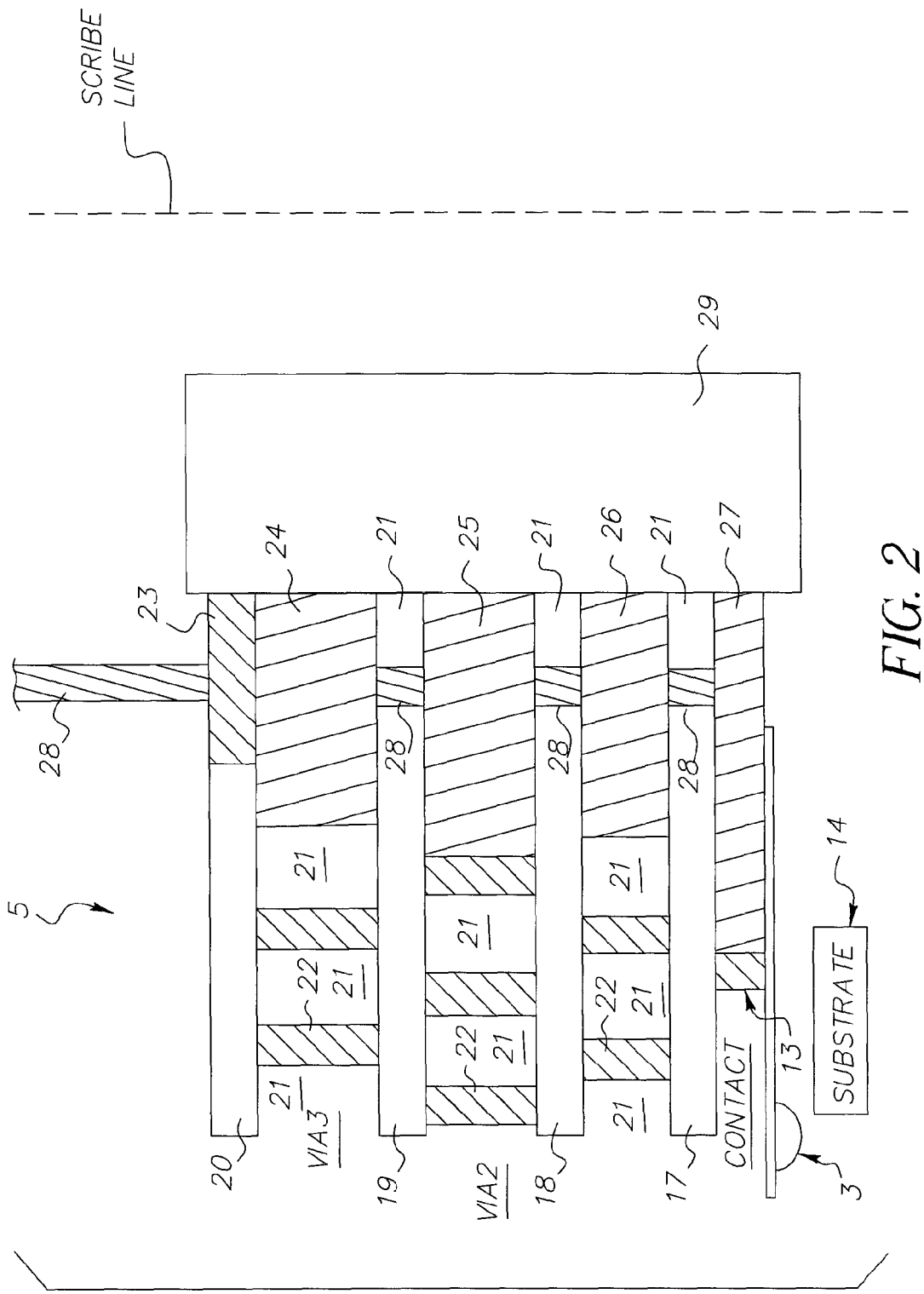
FIG. 2 is a side view of the metal interconnects that connect the transistors to external circuitry.

Referring to FIGS. 1 and 2, there are shown side views in cross section of the CMOS (Complementary Metal-Oxide-Semiconductor) integrated circuits (IC) DIE 5 of the present invention. The CMOS ICs include a plurality of MOSFET (Metal Oxide Semiconductor Field Effect Transistor) transistors each with a gate terminal 10 as well as source 11 and drain 12 terminals. FIG. 2 shows an illustration of the contact 13 and metal layers that can be made for either the source, drain or gate terminals. For thoroughness, it is noted that the image sensor ICs also includes a plurality of photodiodes 3 that receive the incident light that is converted to charge packets in the photodiodes, as is well known in the art.

In order to form the electrical connections, the gate 10 is connected to metal 1 (17*g*) through pre-contact 13*g*, while remaining heavily doped source 11 and drain 12 regions in the semiconductor substrate 14 are connected to metal 1 (17*s*, 17*d*) through their pre-contacts 13*s* and 13*d*, respectively. A channel region 15 in the semiconductor under the gate electrodes 10 separates the source 11 and drain 12. The channel 15 is lightly doped with a dopant type opposite to that of the source 11 and drain 12. The semiconductor is also physically separated from the gate electrode 10, by a gate dielectric layer 16 (for example, $SiO_2/Si_3N_4$). To add the signal and power, routing metal layers 17, 18, 19 and 20 are important to ease the routing (especially automated routing) of logic signals between modules and improves the power and clock distribution to modules. Improved routability is achieved through additional layers of metal 18, 19, and 20. Multiple interconnect metals 17, 18, 19 and 20 are becoming almost mandatory for all of CMOS ICs as well as image sensors (CMOS and CCD).

Each adjacent metal layer 17, 18, 19 and 20 is separated by an intermediate isolation layer 21 and their electrical connections are achieved by VIAs 22 and pre-contact 13. The VIAs 22 and pre-contact 13 are deposited with some better step coverage metal materials, such as Tungsten (W) etc., which is also corrosion-resistant. In order to improve high speed performance particularly when semiconductor scaling down to deep submicron, for example, less than 0.18 micron CMOS or other CCD technology, the copper (Cu) metals 17, 18 and 19 have played an important role to replace a traditional aluminum (Al) metal due to its higher conductivity, lower sheet resistance and lower cost. However, the disadvantage is that Cu is easily oxidized and corroded.

Referring to FIG. 2, in order to make Cu-based IC products fitting to wafer level chip scale packages (CSP), all non-copper based metal layers, such as metal layer 4 (20) and VIAs 22 as well as pre-contacts 13, which are adjacent the periphery of the die 5, are elongated 23, 24, 25, 26 and 27 so that it forms a wall-like extension that extends past the periphery (internal seal rings 28) of the die 5. These elongated metal layers 23, VIAs 24, 25, 26, and pre-contact 27 permit the conductors to be electrically connected to the PADs 29 without extending copper (Cu) metals 17, 18 and 19 past the internal rings 28 of the die 5 that would expose the conductors to the environment, particularly air, that can cause corrosion and/or easy oxidized. The VIAs 22, 24, 25, 26 and pre-contact 13 and 27 are made of corrosion-resistant materials, such as tungsten, that resist corrosion. The interconnect metal layers 17, 18 and 19 are typically made of copper except top metal layer 4 (20), for example. This invention will provide robust connection between leads 23, 24, 25, 26, 27 and PAD 29 extension metals. This invention can be also applied to all CMOS ICs and CCD image sensor products with Cu based interconnect metal layers 17, 18 and 19, for example, potentially using wafer level CSP technology in IC industry.

The invention has been described with reference to a preferred embodiment. However, it will be appreciated that variations and modifications can be effected by a person of ordinary skill in the art without departing from the scope of the invention.

PARTS LIST

3 photodiodes
5 wafer DIE
10 gate
11 source
12 drain
13 pre-contact
17 metal layer 1
18 metal layer 2
19 metal layer 3
20 metal layer 4
21 isolation layer
22 VIAs
23 elongated metal layer
24 elongated metal layer
25 elongated metal layer
26 elongated metal layer
27 elongated metal layer
28 internal seal ring
29 PADs

The invention claimed is:

1. An integrated circuit on a wafer DIE, the DIE comprising:
    (a) a substrate;
    (b) a seal ring disposed perpendicular to the substrate and spanning a portion of the substrate, wherein a first conducting element is disposed laterally to the seal ring and on a first side of the seal ring;
    (c) two metal lines both disposed parallel to the substrate and on a second side of the seal ring opposite the first side, wherein the two metal lines span the substrate in two distinct layers; and
    (d) a second conducting element comprising a substantially non-oxidizing metal that is resistant to oxidation and positioned between the two distinct layers of the two metal lines, wherein the second conducting element spans a portion of the substrate and extends past the seal ring to electrically connect at least one of the two metal lines to the first conducting element.

2. The DIE as in claim 1, wherein the substantially non-oxidizing metal comprises tungsten.

3. The DIE as in claim 2, wherein the first conducting element is a PAD.

4. The DIE as in claim 1, wherein each of the two metal lines comprises an oxidizing metal.

5. The DIE as in claim 1, wherein the second conducting element comprises an elongated VIA.

6. The DIE as in claim 5, wherein one of the two metal lines is positioned immediately above the substrate.

7. The DIE as in claim 6, further comprising a third conducting element comprising a substantially non-oxidizing metal that is resistant to oxidation and positioned between the substrate and the metal line immediately above the substrate, wherein the third conducting element spans a portion of the substrate and extends past the seal ring to electrically connect the metal line immediately above the substrate to the first conducting element.

8. The DIE as in claim 7, wherein the third conducting element comprises an elongated pre-contact.

9. The DIE as in claim 7, wherein the substantially non-oxidizing metal comprises tungsten.

10. The DIE as in claim 1, further comprising a substantially non-oxidizing top metal line resistant to oxidation and disposed parallel to the substrate and spanning the substrate, wherein the top metal line is positioned on both sides of the seal ring and is connected to the first conducting element.

11. An integrated circuit on a wafer DIE, the DIE comprising:
    (a) a substrate;
    (b) a seal ring disposed perpendicular to the substrate, wherein a first conducting element is disposed laterally to the seal ring and on a first side of the seal ring;
    (d) a first metal line and a second metal line both disposed parallel to the substrate and on a second side of the seal ring opposite the first side, wherein the first and second metal lines span the substrate in two distinct layers and the first metal line is positioned immediately above the substrate; and
    (e) a second conducting element comprising a substantially non-oxidizing metal that is resistant to oxidation and positioned between the substrate and the first metal line, wherein the second conducting element spans a portion of the substrate and extends past the seal ring to electrically connect the first metal line to the first conducting element.

12. The DIE as in claim 11, wherein the substantially non-oxidizing metal comprises tungsten.

13. The DIE as in claim 11, wherein the first conducting element is a PAD.

14. The DIE as in claim 11, wherein each of the two metal lines comprises an oxidizing metal.

15. The DIE as in claim 14, further comprising a third conducting element comprising a substantially non-oxidizing metal that is resistant to oxidation and positioned between the two distinct layers of the two metal lines, wherein the third conducting element spans a portion of the substrate and extends past the seal ring for electrically connecting at least one of the two metal lines to the first conducting element.

16. The DIE as in claim 15, wherein the third conducting element comprises an elongated VIA.

17. The DIE as in claim 15, wherein the substantially non-oxidizing metal comprises tungsten.

18. The DIE as in claim 11, wherein the second conducting element comprises an elongated pre-contact.

19. The DIE as in claim 11, further comprising a substantially non-oxidizing top metal layer resistant to oxidation and disposed parallel to the substrate and spanning the substrate, wherein the top metal layer is positioned on both sides of the seal ring and is connected to the first conducting element.

* * * * *